US012598006B2

(12) United States Patent
Li et al.

(10) Patent No.: US 12,598,006 B2
(45) Date of Patent: Apr. 7, 2026

(54) ANTENNA IN PACKAGE, RADIO FREQUENCY CHIP, TEST DEVICE AND TEST METHOD

(71) Applicant: Calterah Semiconductor Technology (shanghai) Co., Ltd., Shanghai (CN)

(72) Inventors: Shan Li, Shanghai (CN); Kaijie Zhuang, Shanghai (CN); Zhefan Chen, Shanghai (CN); Xuejuan Huang, Shanghai (CN); Dian Wang, Shanghai (CN)

(73) Assignee: Calterah Semiconductor Technology (Shanghai) Co., Ltd., Shanghai (CN)

( * ) Notice: Subject to any disclaimer, the term of this patent is extended or adjusted under 35 U.S.C. 154(b) by 90 days.

(21) Appl. No.: 18/632,197

(22) Filed: Apr. 10, 2024

(65) Prior Publication Data

US 2024/0259116 A1      Aug. 1, 2024

Related U.S. Application Data

(63) Continuation of application No. PCT/CN2023/083882, filed on Mar. 24, 2023.

(30) Foreign Application Priority Data

Jun. 15, 2022    (CN) .......................... 202210675967.4

(51) Int. Cl.
*H04B 17/00* (2015.01)
*G01R 29/08* (2006.01)
*H01Q 1/22* (2006.01)

(52) U.S. Cl.
CPC ..... *H04B 17/0085* (2013.01); *G01R 29/0814* (2013.01); *H01Q 1/2283* (2013.01)

(58) Field of Classification Search
CPC ............... G01R 1/045; G01R 29/0814; G01R 31/2822; H01Q 1/22; H01Q 1/2283;
(Continued)

(56) References Cited

U.S. PATENT DOCUMENTS

2004/0012529 A1* 1/2004 Teshirogi ............... H01Q 11/10
343/702
2006/0232491 A1* 10/2006 Nakamura ............. H01Q 1/242
343/841
(Continued)

FOREIGN PATENT DOCUMENTS

CN        210668281 U      6/2020
CN        210805998 U      6/2020
CN        216485374 U      5/2022

OTHER PUBLICATIONS

Calterah Semiconductor Technology (shanghai) Co.,Ltd., International Search Report with English translation, PCT/CN2023/083882, Jul. 6, 2023, 5 pgs.
(Continued)

*Primary Examiner* — Thien M Le
(74) *Attorney, Agent, or Firm* — USCH Law, PC

(57) ABSTRACT

The present disclosure provides an antenna in package, a RF chip, a test device and a test method. The antenna in package includes at least one antenna, one or more coupling structures and at least one testing terminal. The at least one antenna, the one or more coupling structures and the at least one testing terminal are disposed in a package body. The one or more coupling structures are coupled to one or more radiation units of the at least one antenna, and each coupling structure of the one or more coupling structures is coupled to a respective testing terminal of the at least one testing terminal. The one or more coupling structures are configured
(Continued)

to transmit RF test signals of a RF link in which the one or more radiation units are disposed during testing the RF link.

20 Claims, 4 Drawing Sheets

(58) Field of Classification Search

CPC ... H01Q 1/38; H01Q 1/50; H04B 1/40; H04B 17/0085; H04B 17/10; H04B 17/20

See application file for complete search history.

(56) References Cited

U.S. PATENT DOCUMENTS

| | | | | |
|---|---|---|---|---|
| 2010/0052708 | A1* | 3/2010 | Ribeiro | G01R 31/3025 |
| | | | | 324/756.01 |
| 2011/0095950 | A1* | 4/2011 | Yu | H04W 24/06 |
| | | | | 343/703 |
| 2014/0145883 | A1 | 5/2014 | Baks et al. | |
| 2014/0332812 | A1* | 11/2014 | Kang | G01R 31/3025 |
| | | | | 438/18 |
| 2015/0084830 | A1 | 3/2015 | Elsherbini | |
| 2016/0116523 | A1* | 4/2016 | Trotta | H01Q 1/2283 |
| | | | | 343/703 |
| 2016/0306028 | A1* | 10/2016 | Chang | G08G 1/142 |
| 2017/0117633 | A1 | 4/2017 | Park et al. | |
| 2020/0091608 | A1* | 3/2020 | Alpman | H01Q 25/001 |
| 2020/0280129 | A1* | 9/2020 | Miers | H01Q 3/267 |
| 2021/0011069 | A1 | 1/2021 | Chen et al. | |
| 2023/0353259 | A1* | 11/2023 | Hesselbarth | H04B 17/15 |
| 2024/0130660 | A1* | 4/2024 | Frankel | A61B 5/746 |
| 2025/0274145 | A1* | 8/2025 | Takano | H04B 1/0057 |

OTHER PUBLICATIONS

Calterah Semiconductor Technology (Shanghai) Co., Ltd., European Search Report, EP23822729.2, Sep. 9, 2025, 5 pgs.

Calterah Semiconductor Technology (Shanghai) Co., Ltd., European Communication pursuant to Article 94(3) EPC, EP23822729.2, Sep. 19, 2025, 6 pgs.

* cited by examiner

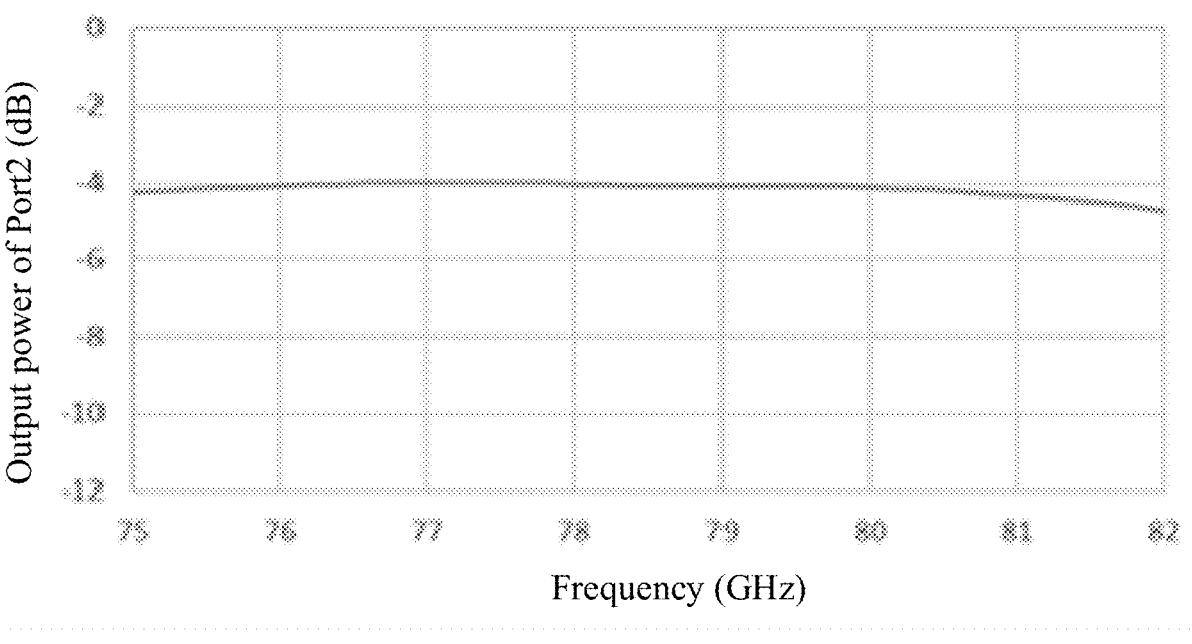

RF test signals from a transmission antenna of the RF chip are acquired using a first RF test link of the RF chip formed by a first probe, a first signal transmission path, and a first testing terminal of the RF chip to be tested, and a RF transmission link of the RF chip is tested

S302

The RF test signals are transmitted to a reception antenna of the RF chip using a second RF test link of the RF chip formed by a second probe, a second signal transmission path, and a second testing terminal of the RF chip to be tested, and a RF reception link of the RF chip is tested

FIG. 6

ANTENNA IN PACKAGE, RADIO FREQUENCY CHIP, TEST DEVICE AND TEST METHOD

CROSS REFERENCE TO RELATED APPLICATIONS

The present application is a continuation of PCT application No. PCT/CN2023/083882, entitled "ANTENNA IN PACKAGE, RADIO FREQUENCY CHIP, TEST DEVICE AND TEST METHOD," filed on Mar. 24, 2023, which claims priority to Chinese patent application No. 202210675967.4, filed on Jun. 15, 2022, each of which is incorporated by reference herein in its entirety.

TECHNICAL FIELD

The present disclosure relates to but is not limited to the field of integrated circuit package technology, in particular to an antenna in package, a radio frequency (RF) chip, a test device and a test method.

BACKGROUND

Antenna-in-package (AiP) technology is a technology that integrates an antenna in a package carrying a chip using packaging materials and a packaging process, which effectively balances antenna performance, cost, and volume, and provides a good antenna solution for system-level chips. After packaging a chip, it is usually necessary to conduct mass production testing, that is, use automatic test equipment (ATE) to test the integrity of the functions of integrated circuits, in order to screen and eliminate defective products during the production process.

During the testing process, a testing method for an end-fire antenna is used to perform alignment coupling on the antennas in the AiP chip, which is prone to lead to problems of poor isolation and fluctuant testing accuracy caused by inaccurate alignment, thereby hindering accurate screening of defective products. Therefore, the above testing method cannot stably test the transmission and reception links for RF test signals in the AiP chip.

SUMMARY

Embodiments of the present disclosure provide an antenna in package, a RF chip, a test device and a test method for addressing the technical problem that test equipment cannot perform stable test on the RF reception and transmission links of a chip having AiP.

At a first aspect, some embodiments of the present disclosure provide an antenna in package including at least one antenna, one or more coupling structures and at least one testing terminal. The at least one antenna, the one or more coupling structures and the at least one testing terminal are disposed in a package body. The one or more coupling structures are coupled to one or more radiation units of the at least one antenna, and each coupling structure of the one or more coupling structures is coupled to a respective testing terminal of the at least one testing terminal. The one or more coupling structures are configured to transmit radio frequency test signals of a radio frequency link in which the one or more radiation units are disposed during testing the radio frequency link.

At a second aspect, some embodiments of the present disclosure provide a radio frequency chip including a die and the antenna in package as described in the first aspect.

The die is coupled to the at least one antenna of the antenna in package to form the radio frequency link. The at least one testing terminal of the antenna in package is configured to form a testing loop using external test equipment and the radio frequency link during testing the radio frequency link.

At a third aspect, some embodiments of the present disclosure provide a test device for a radio frequency chip including a testing circuit board and a chip linking socket. The testing circuit board has at least one signal transmission path configured for testing the radio frequency chip as described in the second aspect. The chip linking socket is disposed on the testing circuit board and is configured to connect to the at least one testing terminal in the radio frequency chip, in order to transmit the radio frequency test signals from a radio frequency test link for the at least one testing terminal using the at least one signal transmission path of the testing circuit board.

At a fourth aspect, some embodiments of the present disclosure provide a test method for a radio frequency chip applicable to test the radio frequency chip as described in the second aspect. The method includes at least one of: acquiring, using a first radio frequency test link of the radio frequency chip formed by a first probe, a first signal transmission path, and a first testing terminal of the radio frequency chip to be tested, radio frequency test signals from a transmission antenna of the radio frequency chip, and testing a radio frequency transmission link of the radio frequency chip; or transmitting, using a second radio frequency test link of the radio frequency chip formed by a second probe, a second signal transmission path, and a second testing terminal of the radio frequency chip to be tested, the radio frequency test signals to a reception antenna of the radio frequency chip, and testing a radio frequency reception link of the radio frequency chip.

Embodiments of the present disclosure provide an antenna in package, a RF chip, and a corresponding test device and test method. The antenna in package includes at least one antenna, one or more coupling structures and at least one testing terminal. The at least one antenna, the one or more coupling structures and the at least one testing terminal are disposed in a package body. The one or more coupling structures are coupled to one or more radiation units of the at least one antenna, and each coupling structure of the one or more coupling structures is coupled to a respective testing terminal of the at least one testing terminal. The one or more coupling structures are configured to transmit radio frequency test signals of a radio frequency link in which the one or more radiation units are disposed during testing the radio frequency link. In the antenna in package, the radio frequency test signals from the radio frequency link are transmitted through the one or more coupling structures, without need of additional external load board, thereby improving the stability of the transmission and reception links for RF test signals. In this way, stable and reliable test can be performed on the transmission and reception links for the RF test signals for the RF chip having the antenna in package.

In some embodiments, each coupling structure of the one or more coupling structures include a sampling unit and a signal transmission path. The sampling unit is coupled to at least one corresponding radiation unit of the one or more radiation units, and the sampling unit is configured to collect the radio frequency test signals from the at least one corresponding radiation unit of the one or more radiation units. The signal transmission path is coupled to the sampling unit and a respective testing terminal of the at least one testing terminal, and the signal transmission path is configured to transmit the radio frequency test signals.

In some embodiments, the sampling unit includes a sheet-shaped structure, and there is an induction gap between the sheet-shaped structure and the at least one corresponding radiation unit of the one or more radiation units, in order for the sheet-shaped structure to inductively couple with the at least one corresponding radiation unit of the one or more radiation units.

In some embodiments, a metal structure in the signal transmission path includes at least one of: metal via holes connecting different metal layers in the package body, a microstrip line disposed in at least one metal layer, a coaxial line, and solder pads.

In some embodiments, metal pins for the at least one testing terminal are exposed outside the package body.

In some embodiments, the at least one testing terminal is configured to connect to test equipment or reference ground.

In some embodiments, a number of the one or more coupling structures corresponds to a number of the at least one antenna, and each coupling structure of the one or more coupling structures is coupled to a respective antenna; or the number of the one or more coupling structures is less than the number of the at least one antenna, and at least one coupling structure of the one or more coupling structures is coupled to a plurality of corresponding antennas.

In some embodiments, the chip linking socket includes a cover plate and a plurality of probes. The cover plate is configured to press on the radio frequency chip. One probe of the plurality of probes is coupled to the at least one signal transmission path and is configured to connect to the at least one testing terminal, in order to communicate with the radio frequency test link.

In some embodiments, the test device further includes: a first testing unit coupled to a signal transmission path in the testing circuit board and configured to convert the radio frequency test signals into intermediate frequency test signals; and a second testing unit coupled to another signal transmission path in the testing circuit board and configured to convert the intermediate frequency test signals into the radio frequency test signals.

BRIEF DESCRIPTION OF THE DRAWINGS

In order to illustrate the technical solutions in related technologies or in the embodiments of the present disclosure more clearly, the drawings to be used in the description of the related technologies or the embodiments will be briefly described below. It is obvious that the drawings mentioned in the following description are only some embodiments of the present disclosure. For those of ordinary skill in the art, other drawings may also be obtained in accordance with these drawings without any inventive effort.

FIG. 5 is a schematic diagram of signal energy received by Port2 in a testing mode provided in some embodiments of the present disclosure.

FIG. 6 is a flow diagram of a test method for a RF chip provided in some embodiments of the present disclosure.

DETAILED DESCRIPTION OF THE EMBODIMENTS

Figure 1:
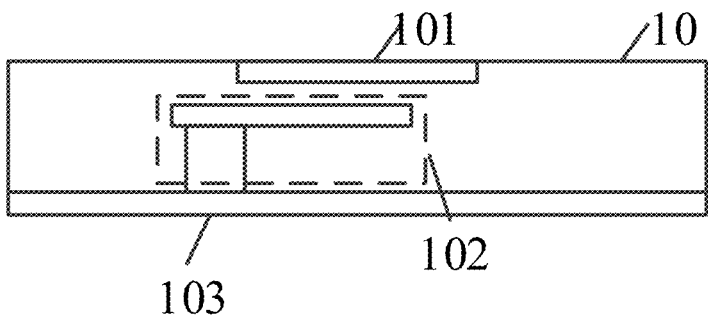
FIG. 1 is a schematic diagram of the structure of the antenna in package provided in some embodiments of the present disclosure.

In order to make the purpose, technical solutions, and advantages of the embodiments of the present disclosure clearer, the following will provide a clear and complete description of the technical solutions in the embodiments of the present disclosure in conjunction with the accompanying drawings in the embodiments of the present disclosure. Obviously, the described embodiments are a part of the embodiments of the present disclosure, not all of them. Based on the embodiments of the present disclosure, all other embodiments obtained by those skilled in the art without any inventive work fall within the scope of protection of the present disclosure.

In the frequency bands for millimeter waves, the electromagnetic waves having wavelengths at the level of millimeter provide possibility for integration of antennas and chips. Antenna-in-package (AiP) technology is a technology that integrates an antenna in a package carrying a chip using packaging materials and a packaging process, which effectively balances antenna performance, cost, and volume, and provides a good antenna solution for system-level chips. After packaging a chip, it is usually necessary to conduct mass production testing, that is, use automatic test equipment (ATE) to test the integrity of the functions of integrated circuits, in order to screen and eliminate defective products during the production process. To this end, the millimeter wave radar sensors use AiP technology to integrate the on-board antennas into the package body of the chip, thereby effectively reducing the overall size of the radar sensors.

In the AiP technology, the radio frequency (RF) signals emitted by a die of the chip is directly radiated into the air through the antennas in the package, or the die of the chip directly receives external input RF signals through the antennas in the package. Based on this, during the mass production testing process for a AiP chip, in order to measure RF signals while achieving the fixing and pressing effect of fixture on the AiP chip, it is proposed to dispose an antenna on the fixture to near-field couple the energy of the antennas in the AiP chip. For example, by providing an external testing interface including a first antenna and a second antenna that are electromagnetically coupled with the transmitting antenna and receiving antenna of the AiP chip through corresponding waveguide structures, the test signals emitted by the transmitting antenna of the AiP chip are transmitted to the receiving antenna of the AiP chip through the external first and second antennas sequentially, in order to complete the testing of the transmission and reception links for the RF test signals in one time.

However, due to the very small size of the AiP chip and the extremely small spacing between the antennas in the AiP chip, the above testing method has problems as follows. Firstly, a test fixture which is specially customized according to the antenna distribution on each AiP chip is needed.

Secondly, due to the use of near-field coupling, testing instability caused by the position deviation of the fixture may occur. Therefore, how to achieve mass production testing that is universal to AiP chips and not sensitive to fixtures has become an urgent demand.

To this end, embodiments of the present disclosure provide an antenna in package, a RF chip, a test device and a test method. By providing one or more coupling structures coupled to the one or more radiation units of the at least one antenna, and coupled to the at least one testing terminal in the package body carrying the at least one antenna, the RF test signals of the RF link in which the one or more radiation units are disposed are transmitted by the one or more coupling structures during testing the RF link. In this way, the impact on testing due to alignment deviation between the AiP chip and the load board, antenna isolation or the like can be reduced, thereby effectively improving testing stability for the transmission and reception links for the RF test signals in the AiP chip. In other words, the present disclosure provides a solution at the AiP end, in order to address the above-mentioned technical problem.

The term "coupled" or "couple" may have several different meanings depending on the context in which the term is used. For example, the term "couple" may have the meaning of mechanical coupling or electrical coupling. As used in the present disclosure, the terms "coupled" or "couple" may mean that two components or devices may be directly connected to each other or connected to each other through one or more intermediate components or devices and via electrical components, electrical signals, or mechanical components (such as, but not limited to, wires or cables, depending on the specific application). Examples for the "couple" in the present disclosure include direct electrical connection, electrical induction connection, or optical coupling connection, etc. For example, using the connection methods used in semiconductor manufacturing processes to achieve electrical connection between two electrical components. For example, signal connection between two electrical components is achieved using non-contact connection methods utilizing such as optocoupler components, inductive components or the like. For another example, the connection method between pins of a chip and a socket is used to assist in electrical or signal connection between two electrical components.

At least one embodiment of the present disclosure provides an antenna in package, and the structure of the antenna in package in the present disclosure will be described in the following. It is noted that the following embodiments may be combined with each other, and the same or similar concepts or processes may not be repeated in some embodiments. FIG. 1 is a schematic diagram of the structure of the antenna in package provided in some embodiments of the present disclosure. As shown in FIG. 1, the antenna in package 10 includes at least one antenna 101, one or more coupling structures 102 and at least one testing terminal 103.

The at least one antenna 101, the one or more coupling structures 102 and the at least one testing terminal 103 are all disposed in a package body for a die 20 (not shown in FIG. 1).

The one or more coupling structures 102 are coupled to one or more radiation units 106 (not shown in FIG. 1) of the at least one antenna 101, and each coupling structure of the one or more coupling structures 102 is coupled to a respective testing terminal of the at least one testing terminal 103, and the one or more coupling structures 102 are configured to transmit RF test signals of a RF link in which the one or more radiation units 106 are disposed during testing the RF link.

It is noted that the above antenna 101 may be a patch antenna 101, which may include a metal patch, a feeding structure connected to the metal patch and the like. The above antenna may also be a slot antenna (not shown), which includes a metal layer with slots and a feeding structure connected to the metal layer. The feeding structure in any of the above examples for example includes any one of: a coaxial feeding structure, a microstrip feeding structure, a slot feeding structure or the like.

Figure 2:
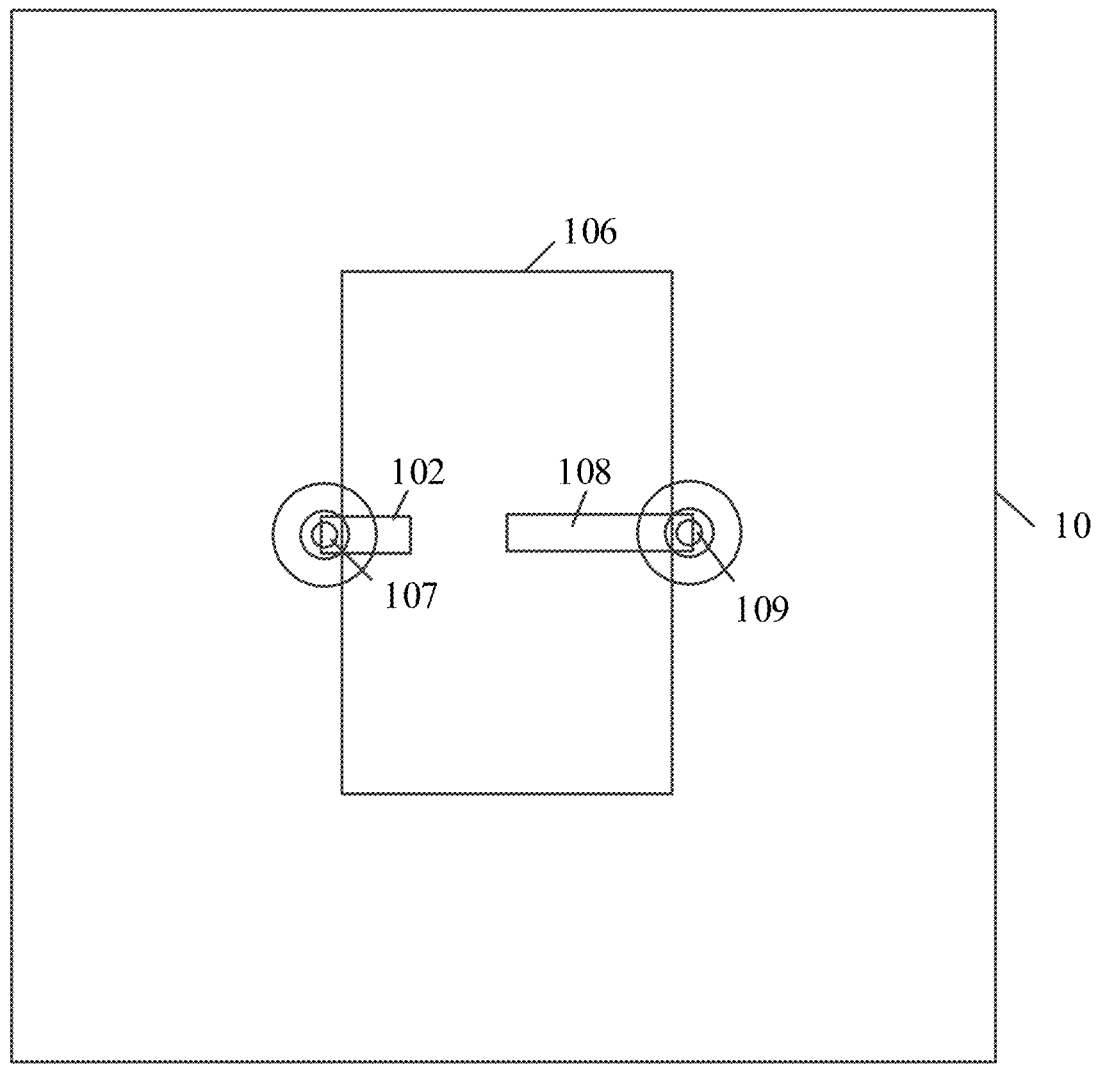
FIG. 2 is a top view of the antenna in package provided in some embodiments of the present disclosure.
Figure 3:
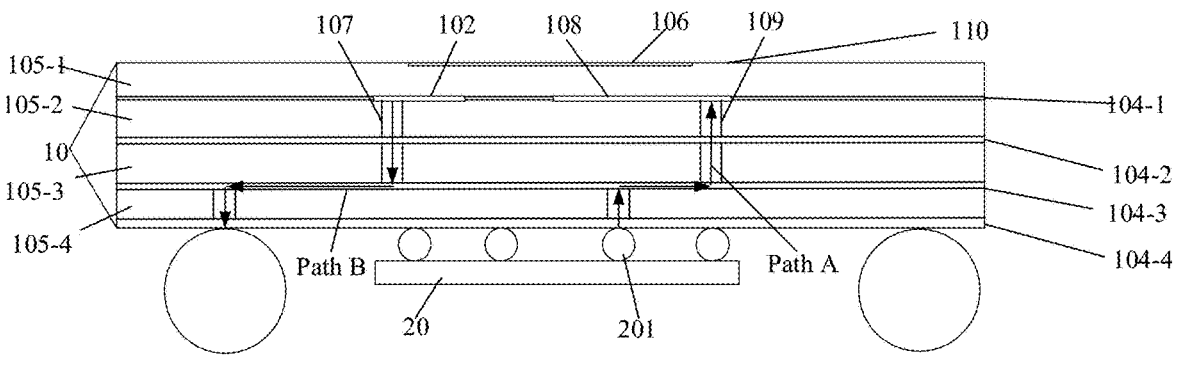
FIG. 3 is a front view of the antenna in package provided in some embodiments of the present disclosure.

In some embodiments, the package body of the antenna in package 10 may be composed of a metal layer (including a rewiring layer, the metal layer where the one or more radiation units of the antenna are disposed, etc.) and an intermediate dielectric layer 105. Exemplary, FIG. 2 is a top view of the antenna in package provided in some embodiments of the present disclosure, and FIG. 3 is a front view of the antenna in package provided in some embodiments of the present disclosure. As shown in FIGS. 2 and 3, the metal layer where the one or more radiation units of the antenna are disposed (110 as shown in FIG. 3), the multi-layer rewiring layer 104 (layers denoted by 104-1, 104-2, 104-3 and 104-4 as shown in FIG. 3), and the multi-layer intermediate medium layer 105 (layers denoted by 105-1, 105-2, 105-3 and 105-4 as shown in FIG. 3) may overlap to form the package body containing the antenna in package 10.

It is noted that the material of the rewiring layer in the embodiments of the present disclosure is metal, such as iron, copper, or aluminum, and the material of the intermediate dielectric layer 105 may include organic materials or glass.

The one or more radiation units 106 are arranged in a metal layer functioning as the upper surface of the antenna in package 10 in order to contact with free space. The one or more coupling structures 102 are arranged in the package body, and the shape of the one or more radiation units 106 may include rectangular sheet or patch structure or slot structure with a rectangular envelope contour, as shown in FIGS. 2 and 3. The one or more coupling structures 102 are coupled to the one or more radiation units through electrical connection or inductive coupling. The shape of the one or more coupling structures 102 may be shown as the rectangular strip in FIG. 2. There may be one coupling structure or a plurality of coupling structures 102. In some embodiments, a number of the one or more coupling structures 102 corresponds to a number of the at least one antenna 101, and each coupling structure of the one or more coupling structures 102 is coupled to a respective antenna 101. For example, the AiP chip includes a plurality of receiving antennas 101, the radiation unit of each receiving antenna is coupled to a respective coupling structure 102, and each coupling structure 102 is connected to a respective (or a same) testing terminal.

In some other embodiments, the number of the one or more coupling structures 102 is less than the number of the at least one antenna 101, and at least one coupling structure of the one or more coupling structures 102 is coupled to a plurality of corresponding antennas 101. For example, the AiP chip includes a plurality of transmitting antennas 101, at least one radiation unit of the plurality of transmitting antennas is coupled to a respective coupling structure 102, and each coupling structure 102 is connected to a respective (or a same) testing terminal.

In some other embodiments, different antennas are coupled to a respective coupling structure. Devices such as switches may be used to switch between different coupling structures and transmission paths (or testing terminals), thereby simplifying the complexity of circuit design in the package body.

FIGS. 2 and 3 show a partial structure of the antenna in package 10, and the structure of the antenna in package 10 in the technical solution of the present disclosure may further include a feeding structure 108 or the like.

The following will describe the feeding method of the antenna in package 10 according to the present disclosure. As shown in FIGS. 2 and 3, the feeding structure 108 may be arranged in the uppermost intermediate dielectric layer (i.e. 105-1 as shown in FIG. 3) of the antenna in package 10. In some other embodiments, the feeding structure may also be implemented by the rewiring layer 104-1 as shown in FIG. 3.

In some embodiments, as shown in FIGS. 2 and 3, the feeding structure 108 may be electromagnetically coupled with the one or more radiation units 106. In some other embodiments, the feeding structure 108 may also be directly connected to the one or more radiation units 106.

In some embodiments, the feeding structure 108 may also be connected to the bump structure 201 on the die 20 of the RF chip through the second via hole 109. The bump structure 201 may come into contact with the lowermost rewiring layer (i.e. 104-4 as shown in FIG. 3, also known as "reference ground layer") of the antenna in package 10, and the second via hole 109 passes through the intermediate dielectric layers (which may include 105-2, 105-3, and 105-4 as shown in FIG. 3) and rewiring layers (which may include 104-1, 104-2, 104-3, and 104-4 as shown in FIG. 3) between the feeding structure 108 and the bump structure 201.

It is noted that the feeding structure 108 is configured to transmit or receive electromagnetic wave signals through the one or more radiation units 106, and the second via hole 109 is configured to transmit the electromagnetic wave signals transmitted from the bump structure 201 to the feeding structure 108 or transmit the electromagnetic wave signals received by the feeding structure 108 to the bump structure 201.

In order to facilitate the testing of an AiP chip and effectively reduce problems in testing accuracy caused by inaccurate alignment between the antennas in the AIP chip and the waveguide structure of the test equipment, the embodiments of the present disclosure provide an antenna in package applicable for testing, which not only includes the antennas as described above, but also includes one or more coupling structures 102.

In some embodiments, each coupling structure of the one or more coupling structures 102 include a sampling unit and a signal transmission path. The sampling unit is coupled to at least one corresponding radiation unit of the one or more radiation units 106, and the sampling unit is configured to collect the RF test signals from the at least one corresponding radiation unit of the one or more radiation units 106.

The sampling unit is coupled to the at least one corresponding radiation unit of the one or more radiation units of the antenna. For example, the sampling unit is disposed in a metal layer (i.e. the rewiring layer 104-1 as shown in FIG. 3) under the metal layer where the one or more radiation units are disposed, and is coupled to the at least one corresponding radiation unit of the one or more radiation units by inductive coupling. To this end, the sampling unit may include a sheet-shaped structure, which forms an electrical induction structure with the at least one corresponding radiation unit of the one or more radiation units. The height of the intermediate dielectric layers between the sheet-shaped structure and the one or more radiation units may be set based on the corresponding induction distance, in order for the sampling unit and the at least one corresponding radiation unit of the one or more radiation units to couple inductively. As another example, the sampling unit is directly electrically connected to the at least one corresponding radiation unit of the one or more radiation units. To this end, the sampling unit may be a contact structure contacting with the at least one corresponding radiation unit of the one or more radiation units, for example, solder pads of metal via holes, one end of microstrip lines or the like that are electrically connected with the one or more radiation units.

It is noted that according to the principle of reversible signal transmission, when the sampling unit is coupled to a radiation unit of a transmitting antenna, the RF test signals can be sampled from the radiation unit, and when the sampling unit is coupled to a radiation unit of a receiving antenna, the received RF test signal can be transmitted to the radiation unit. Therefore, the above conditions are both referred to as that the sampling unit samples the RF test signal from the at least one corresponding radiation unit of the one or more radiation units.

In some other embodiments, the sampling unit further includes an impedance matching portion being coupled to the at least one corresponding radiation unit of the one or more radiation units 106, in order to configure the energy of the sampled RF test signal. The impedance matching portion is configured to match external test equipment or reduce the energy of the sampled RF test signal.

The signal transmission path is connected (i.e. coupled) to the sampling unit and a respective testing terminal of the at least one testing terminal. For example, a metal structure connected to the sampling unit and the at least one testing terminal is formed using rewiring layers, and even using holes between rewiring layers or the like. In some embodiments, the signal transmission path includes a metal structure arranged in the package body. The signal transmission path is configured to transmit the RF test signals.

The metal structure in the signal transmission path may include at least one of: metal via holes connecting different metal layers of the package body, microstrip lines disposed in at least one metal layer, coaxial lines, solder pads or the like.

An example for the at least one testing terminal 103 is metal pins of the chip which may be exposed outside the package body.

In some embodiments, the at least one testing terminal 103 is configured to connect with test equipment or reference ground.

In some embodiments, continuing to refer to FIGS. 2 and 3, a coupling structure 102 may be electromagnetically coupled with a radiation unit 106, and may also be connected to a testing terminal 103 through the metal structure in the signal transmission path. The metal structure may include a first via hole 107 that connects different metal layers of the package body, and the first via hole 107 passes through the intermediate dielectric layers (which may include 105-2, 105-3, and 105-4 as shown in FIG. 3) and rewiring layers (which may include 104-1, 104-2, 104-3, and 104-4 as shown in FIG. 3) between the one or more coupling structures 102 and the at least one testing terminal 103. The metal structure may further include microstrip lines, coaxial lines, and solder pads. The signal transmission path is connected to a respective testing terminal of the at least one testing terminal to implement electrical connection between the one or more coupling structures and external test equipment.

In order to prevent RF signal interference between the feeding structure 108 and the one or more coupling structures 102, in some embodiments, the distance between the feeding structure and the one or more coupling structures is greater than a preset safety distance (within which the RF signal interference between the feeding structure and the one or more coupling structures can be maintained within an allowable range), and the one or more coupling structures 102 are arranged on a side away from the feeding structure 108. The one or more coupling structures 102 may be in the same intermediate dielectric layer (105-1 as shown in FIG. 3) as the feeding structure 108, or the one or more coupling structures may be in a different intermediate dielectric layer than the feeding structure 108.

In the embodiments of the present disclosure, the design process of the AiP chip may be combined with the ATE testing process. By designing the internal structure of the antenna in package 10, the antenna in package 10 has at least two types of ports. The signal port Port1 is configured to connect the feeding structure 108 with the RF port of the die of the chip to achieve signal connection between the antenna in package 10 and the RF circuit. The testing terminal Port2 is connected to the one or more coupling structures 102 for the ATE to perform testing. In ATE testing mode, after avoiding the area for the antenna 101 of the AiP chip on the Socket pressing block, the pins corresponding to Port2 are connected, using probes or the like, to the test equipment for testing. In usage mode, when the AiP chip is used on a board of a product, Port2 may be opened or shorted. For example, each testing terminal Port2 is short-circuited and grounded to the reference ground.

It is noted that by designing the one or more coupling structures 102, during testing, the signals obtained (or output) by the one or more coupling structures 102 are related to the signals transmitted (or received) by the feeding structure 108, and the one or more coupling structures are electrically connected to the test equipment through the at least one testing terminal. In this way, the test equipment can measure the radiation electromagnetic waves radiated into the air without need of complex structures. Therefore, the test equipment can use its probes to test the radiation signals from the RF links.

Figure 4A:
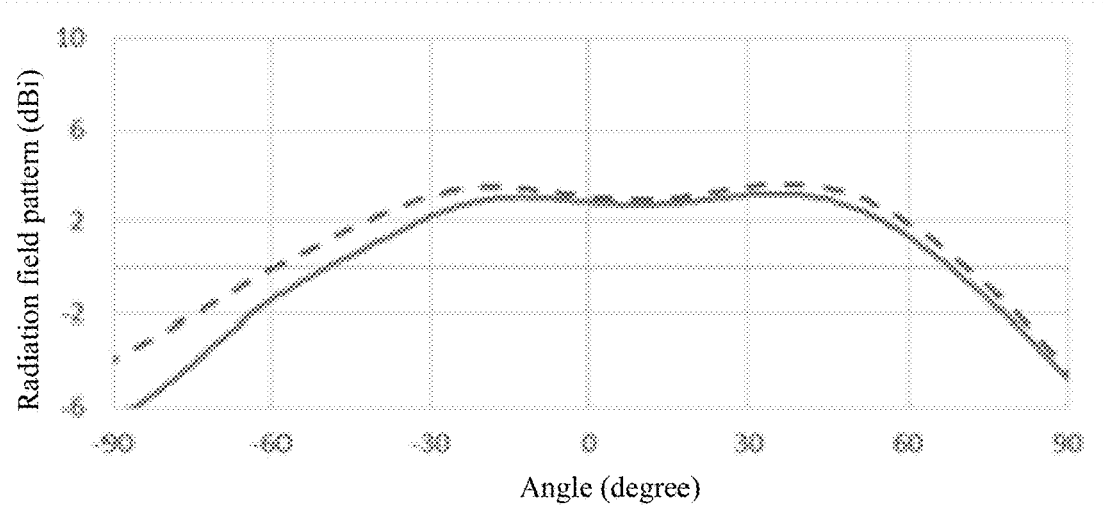
FIG. 4A is a diagram of elevation radiation directions of the antenna in package provided in some embodiments of the present disclosure.
Figure 4B:
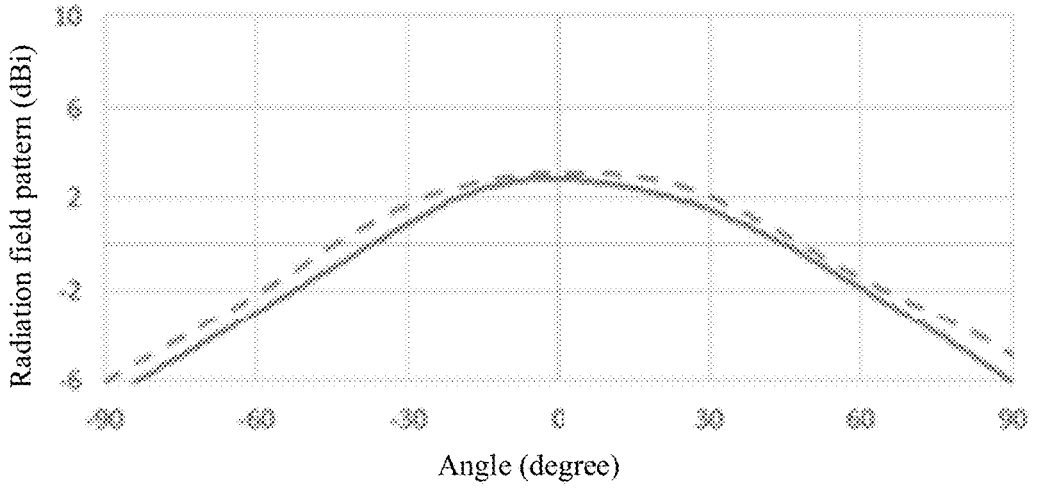
FIG. 4B is a diagram of azimuth radiation directions of the antenna in package provided in some embodiments of the present disclosure.

FIGS. 4A and 4B show the influence on the characteristics of the AiP structure after adding a testing structure (namely the structure which includes the aforementioned one or more coupling structures and at least one testing terminal and is configured to test RF links of the AiP chip). The dashed lines represent the characteristics of the AiP without the testing structure, and the solid lines represent the radiation characteristics of the AiP with the testing structure. There is no significant change in usage between the characteristics. FIG. 4A provides a diagram of elevation radiation directions of the antenna in package 10, and FIG. 4B is a diagram of azimuth radiation directions of the antenna in package 10 provided in some embodiments of the present disclosure.

In FIGS. 4A and 4B, the dashed lines represent the radiation direction curves for the antenna 101 when Port2 is in a conducting state, and the solid lines represent the radiation direction curves of the antenna 101 when Port2 is in an open-circuit state. As shown in FIGS. 4A and 4B, compared to the condition that Port2 is in the open-circuit state, when Port2 is in the conducting state, the influence on the radiation characteristics of the antenna in package 10 is very small.

FIG. 5 is a schematic diagram of signal energy received by Port2 in a testing mode provided in some embodiments of the present disclosure. As shown in FIG. 5, the energy of the signals received by Port2 is relatively low, approximately −4 decibels (dB). This energy is only an example and aims to characterize that the signals received by the testing port is 4 dB lower than the signals output by the chip. It is noted that this energy may be adjusted by adjusting the spacing between the testing structure and the radiation structure or the shapes of the testing structure and the radiation structure. Thus, the structure of the package module of the RF chip provided in the embodiments of the present disclosure achieves normal operation of the antenna 101 which is not influenced by testing of the chip (i.e. the AiP chip to be tested).

Some embodiments of the present disclosure provide a RF chip including an antenna in package 10 and a die 20. The die 20 is coupled to the at least one antenna 101 in the antenna in package 10 to form the RF link.

The at least one testing terminal 103 of the antenna in package 10 is configured to form a testing loop using external test equipment and the RF link during testing the RF link.

In some embodiments, each external test equipment is connected to the one or more coupling structures 102 of one antenna in package 10. In some other embodiments, each external test equipment may be connected to the one or more coupling structures 102 of a plurality of antennas in package 10. For example, when the package module of the RF chip includes a plurality of transmitting antennas 101 and receiving antennas 101, all transmitting antennas 101 may use a same testing terminal 103 and be accessed to a same external test equipment. All receiving antennas 101 may use a same testing terminal 103 and be accessed to a same external test equipment. In this way, the number of testing terminals 103 can be effectively reduced. The correspondence relationship between the testing terminals 103 and the antennas in package 10 may be implemented by designing the first via hole 107.

As shown in FIGS. 4A and 4B, during the use of the RF chip, each test portion 103 in the antenna in package 10 is connected to the reference ground or shorted, thereby bringing little influence to the signal radiation of the RF chip.

Some embodiments of the present disclosure provide a test device for a RF chip. The test device includes a testing circuit board and a chip linking socket. The testing circuit board is a PCB having testing circuits, testing transmission paths (also known as signal transmission paths) and the like.

There are testing contacts disposed on the testing circuit board. During testing, the chip linking socket applies pressure on the chip, causing each pin of the RF chip (such as AiP chip) to be connected to a respective probe in the chip linking socket, in order to implement electrical connection between each probe and each testing contact on the testing circuit board, thereby implementing the connection between the pins corresponding to the at least one testing terminal in the chip and the signal transmission paths disposed on the testing circuit board. Each testing contact and the corresponding signal transmission path at least correspond to a respective pin of the chip to output/input test signals. For example, the test signals include: RF test signals configured to test the transmission links of the chip, RF test signals configured to test reception links of the chip, or signals configured to transmit various types of data generated by the chip during testing.

In some embodiments, the socket includes a cover (also known as a cover plate) and a plurality of probes. The cover can achieve normal operation of the antennas as long as avoiding the area for the antennas of the AiP. The plurality of probes may be elastic needles that apply pressure transferred from the cover when the cover presses on the chip to the chip. The plurality of probes are electrically connected to the signal transmission paths of the testing circuit board.

Figure 7:
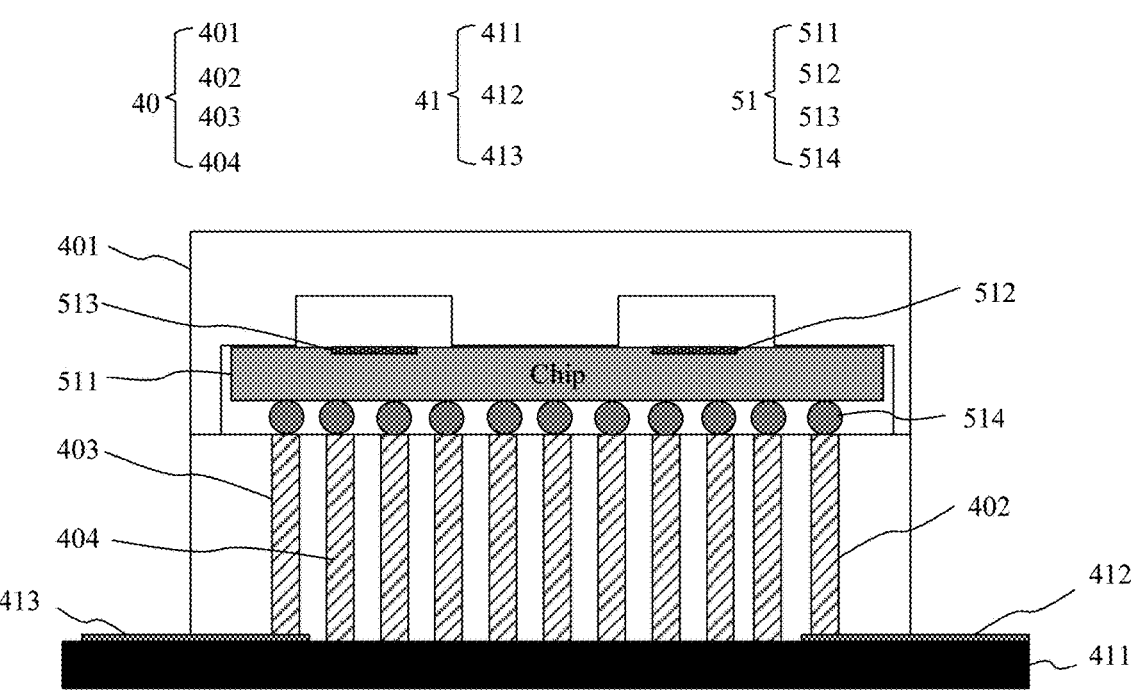
FIG. 7 is a structural schematic diagram of a test device loaded with an AiP chip provided in some embodiments of the present disclosure.

Referring to FIG. 7, FIG. 7 is a structural schematic diagram of a test device loaded with an AiP chip. The AiP chip 51 to be tested includes: a chip housing 511, a transmitting antenna 512 and a receiving antenna 513 disposed on a top surface of the housing, and a plurality of pins 514 of the chip. The plurality of pins 514 of the chip include a first testing terminal for acquiring RF test signals sampled from the transmitting antenna, and a second testing terminal for providing RF test signals to the receiving antenna.

Accordingly, the test device includes a chip linking socket 40 and a testing circuit board 41. The chip linking socket 40 is fixedly/detachably connected to the testing circuit board 41. The chip linking socket 40 includes a cover 401 and a plurality of probes. The plurality of probes include a probe 402 connected to the pin corresponding to the first testing terminal of the chip, a probe 403 connected to the pin corresponding to the second testing terminal of the chip, and probes 404 connected to other pins of the chip. The testing circuit board 41 has a stacked structure including a substrate (also known as a load board or loadboard) 411, a signal transmission path 412 connected with the probe 402 configured to output RF test signals from the AiP chip, a signal transmission path 413 connected with the probe 403 configured to input RF test signals to the AiP chip, and the signal transmission paths (not shown) connected to other probes 404.

Figure 8:
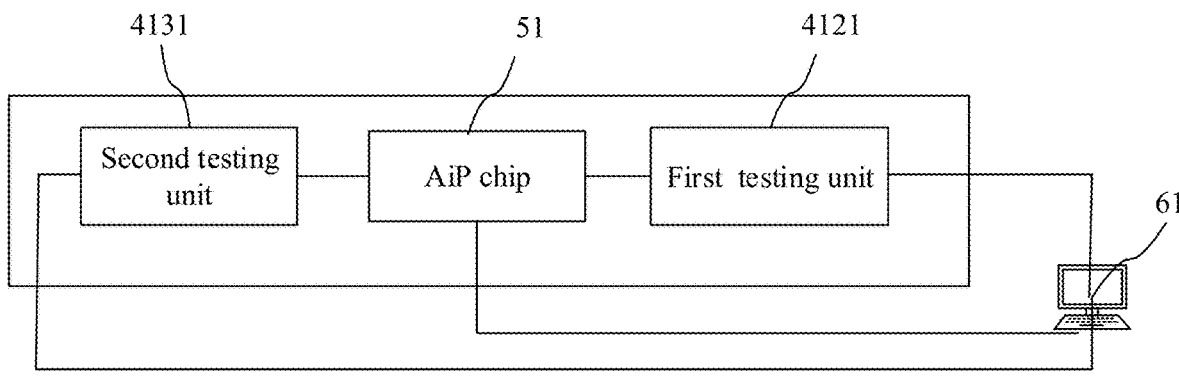
FIG. 8 is a connection schematic diagram of the test device loaded with the AiP chip and test equipment provided in some embodiments of the present disclosure.

Referring to FIG. 8, FIG. 8 is a connection schematic diagram of the test device loaded with the AiP chip and corresponding test equipment. The test equipment 61 is connected to the first testing unit 4121 and the second testing unit 4131 through individual signal transmission path, respectively. Using these two paths, the test equipment 61 can measure the signal energy on the pins of the AiP chip. The first testing unit 4121 and the second test unit 4131 in FIG. 8 are only circuit schematic diagrams. The first testing unit 4121 and the second testing unit 4131 may be separate circuits/chips or integrated in a same chip for testing. Alternatively, the first testing unit 4121 and the second testing unit 4131 may be integrated in the test equipment 61.

Related to the actual radiation frequency bands of the chip to be tested, as the RF signals of the AiP chip are usually in the millimeter wave frequency bands, using instruments and equipment in the millimeter wave frequency band (also known as test equipment 61) for direct measurement in mass production testing will greatly increase the cost during the production testing process.

In the solution of the present disclosure, when testing the RF transmission links of chip 51, the RF test signals in the millimeter wave frequency bands output by the corresponding testing terminal of the chip 51 is downconverted, by the first testing unit 4121, to intermediate frequency test signals with a frequency at the level of MHz, so that the test equipment for mass production testing can be used for testing. The first testing unit includes a down converting circuit, an analog to digital converter (ADC) and the like.

The second testing unit can convert the intermediate frequency test signals into the RF test signals. When testing the RF receiving links of the chip 51, the test equipment generates the RF test signals using the second testing unit 4131, and inputs the RF test signals to the corresponding testing terminal of the chip 51 through corresponding signal transmission path, in order for performing corresponding testing through the signal pins connected to the RF receiving links inside the chip. The second testing unit includes frequency modulated continuous wave (FMCW) signal generation circuit, frequency doubling circuit, driver amplification circuit and the like.

Some embodiments of the present disclosure provide a test method for a RF chip, applicable to the RF chip provided in the above embodiments. The test method may be mainly performed by test equipment. The test equipment includes a processor, a memory and the like, and is configured to control each testing unit of the test device corresponding to a respective RF chip to be tested. The testing units include the first and second testing units mentioned in the above embodiments. The embodiments of the present disclosure may include one or more testing items for testing the RF links of the AiP chip using test equipment and the test device. For example, RF signal strength, bandwidth, frequency linearity of FMCW signals or the like are tested.

The test method for the RF chip according to the embodiments may include at least one of:

At S301, RF test signals from a transmission antenna of the RF chip are acquired using a first RF test link of the RF chip formed by a first probe, a first signal transmission path, and a first testing terminal of the RF chip to be tested, and a RF transmission link of the RF chip is tested.

In an example of using the AiP structure provided in the present disclosure to test the RF transmission links, the test equipment may determine whether the RF transmission links of the chip are working normally by measuring the signal strength or sweep bandwidth output from the pin corresponding to the first testing terminal preset on the chip. In another example, the test equipment tests the intermediate frequency test signals converted into intermediate frequency using the first testing unit to determine whether the FMCW signals emitted by the RF transmission links meets the frequency linearity index or the like.

At S302, the RF test signals are transmitted to a reception antenna of the RF chip using a second RF test link of the RF chip formed by a second probe, a second signal transmission path, and a second testing terminal of the RF chip to be tested, and a RF reception link of the RF chip is tested.

In some embodiments, S301 may be performed to test the RF transmission links, and then S302 may be performed to test the RF reception links of the RF chip. The flowchart for testing the RF chip may be shown in FIG. 6. It is noted that when the test method for RF chips includes the above two operations, embodiments do not limit the order of the above two operations.

In an example of using the AiP structure provided in the present disclosure to test the RF reception links, the test equipment may determine whether the signals of AiP are working normally by measuring the signal strength output from the pin corresponding to the second testing terminal preset on the chip. The test equipment also inputs RF test signals working in the millimeter wave frequency bands to the chip using the second testing unit, and uses the circuit structure inside the chip to measure the strength of the signals in the chip. The strength is output through the pin corresponding to the second testing terminal of the chip, thereby determining whether the reception links are working normally. In this way, mass production screening can be achieved.

In addition, when the test method in the present disclosure is implemented in the form of software functional units and sold or used as an independent product, it may be stored in a computer readable storage medium. Based on this understanding, the technical solution of the present disclosure, in essence, or the portion that contributes to the existing technology or the portion of the technical solution, may be implemented in the form of a software product which is stored in a storage medium and includes some instructions to enable a computer device (which may be a personal computer, a server, or a network device, etc.) to perform all or part of the operations of the method in the embodiments of the present disclosure.

In the embodiments provided in the present disclosure, the computer readable and writable storage medium may include read-only memory, random access memory, EEPROM, CD-ROM or other optical disk storage devices, disk storage devices or other magnetic storage devices, flash memory, USB flash drives, mobile hard drives, or any other medium that can be used to store desired program code in the form of instructions or data structures and can be accessed by a computer. Additionally, any connection may be appropriately referred to as a computer-readable medium. For example, when the instructions are sent from a website, a server, or other remote source using coaxial cable, fiber optic cable, twisted pair, digital subscriber line (DSL), or wireless technologies such as infrared, radio, and micro-wave, then the coaxial cable, fiber optic cable, twisted pair, DSL, or the wireless technologies such as infrared, radio, and microwave are included in the definition of the medium. However, it should be understood that computer readable and written storage media and data storage media do not include connections, carriers, signals, or other transitory media, but are intended for non-transitory, tangible storage media. The disks and optical discs used in the present disclosure include compressed optical discs (CDs), laser discs, optical discs, digital multifunctional discs (DVDs), floppy discs, and Blu-ray discs. The disks typically copy data magnetically, while the optical discs use lasers to copy data optically.

At one or more exemplary aspects, the functions of the computer program for the method according to the present disclosure may be implemented in hardware, software, firm-ware, or any combination thereof. When implemented by software, these functions may be stored or transmitted, as one or more instructions or codes, to a computer-readable medium. The operations of the method or algorithm dis-closed in the present disclosure may be implemented by processor executable software modules, which may be stored on a tangible, non-transitory computer readable and writable storage medium. A tangible, non-transitory com-puter readable and writable storage medium may be any available medium that a computer can access.

The flowchart and block diagram in the accompanying drawings of the present disclosure illustrate the possible architecture, functions, and operations of the system, method, and computer program product according to various embodiments of the present disclosure. Based on this, each box in a flowchart or block diagram may represent a module, a program segment, or part of codes that contains one or more executable instructions for implementing specified logical functions. It should also be noted that in some alternative implementations, the functions indicated in the boxes may also occur in a different order than those indi-cated in the accompanying drawings. For example, two consecutive boxes may actually be executed in parallel, and sometimes they may also be executed in the opposite order, depending on the function involved. It should also be noted that each box in the block diagram and/or flowchart, as well as the combination of boxes in the block diagram and/or flowchart, may be implemented by dedicated hardware-based systems that perform specified functions or opera-tions, or by the combination of dedicated hardware and computer instructions.

It should be noted that the above embodiments are only used to illustrate the technical solution of the present dis-closure and not to limit it. Although the present disclosure has been described in detail with reference to the aforemen-tioned embodiments, those skilled in the art should under-stand that they can still modify the technical solutions recited in the aforementioned embodiments, or equivalently substitute some or all of the technical features. These modifications or substitutions do not make the essence of the corresponding technical solutions deviate from the scope of the technical solutions of the various embodiments of the present disclosure.

What is claimed is:

1. An antenna in package, comprising at least one antenna, one or more coupling structures and at least one testing terminal; wherein:

the at least one antenna, the one or more coupling structures and the at least one testing terminal are disposed in a package body;

the at least one antenna includes one or more radiation units, the one or more coupling structures are coupled to the one or more radiation units, and each coupling structure of the one or more coupling structures is coupled to a respective testing terminal of the at least one testing terminal; and the one or more radiation units are disposed in a radio frequency link, and the one or more coupling structures are configured to transmit radio frequency test signals from the radio frequency link during testing the radio frequency link.

2. The antenna in package according to claim 1, wherein each coupling structure of the one or more coupling struc-tures comprises a sampling unit and a signal transmission path;

wherein the sampling unit is coupled to at least one corresponding radiation unit of the one or more radia-tion units, and the sampling unit is configured to collect the radio frequency test signals from the at least one corresponding radiation unit of the one or more radia-tion units; and the signal transmission path is coupled to the sampling unit and a respective testing terminal of the at least one testing terminal, wherein the signal transmission path is configured to transmit the radio frequency test signals.

3. The antenna in package according to claim 2, wherein the sampling unit comprises a sheet-shaped structure, and there is an induction gap between the sheet-shaped structure and the at least one corresponding radiation unit of the one or more radiation units, in order for the sheet-shaped struc-ture to inductively couple with the at least one correspond-ing radiation unit of the one or more radiation units.

4. The antenna in package according to claim 2, wherein a metal structure in the signal transmission path comprises at least one of: metal via holes connecting different metal layers in the package body, a microstrip line disposed in at least one metal layer, a coaxial line, and solder pads.

5. The antenna in package according to claim 1, wherein metal pins for the at least one testing terminal are exposed outside the package body.

6. The antenna in package according to claim 1, wherein the at least one testing terminal is configured to connect to test equipment or reference ground.

7. The antenna in package according to claim 1, wherein a number of the one or more coupling structures corresponds to a number of the at least one antenna, and each coupling structure of the one or more coupling structures is coupled to a respective antenna; or the number of the one or more coupling structures is less than the number of the at least one antenna, and at least one coupling structure of the one or more coupling structures is coupled to a plurality of corresponding antennas.

8. The antenna in package according to claim 1, further comprising a feeding structure;
  wherein the feeding structure is electromagnetically coupled to the one or more radiation units and is configured to transmit or receive the radio frequency test signals through the one or more radiation units.

9. The antenna in package according to claim 8, wherein a distance between the feeding structure and the one or more coupling structures is greater than a preset safety distance.

10. A radio frequency chip, comprising a die and an antenna in package; wherein:
  the antenna in package comprises at least one antenna, one or more coupling structures and at least one testing terminal;
  the at least one antenna, the one or more coupling structures and the at least one testing terminal are disposed in a package body;
  the at least one antenna includes one or more radiation units, the one or more coupling structures are coupled to the one or more radiation units, and each coupling structure of the one or more coupling structures is coupled to a respective testing terminal of the at least one testing terminal;
  the one or more radiation units are disposed in a radio frequency link, and the one or more coupling structures are configured to transmit radio frequency test signals from the radio frequency link during testing the radio frequency link;
  the die is coupled to the at least one antenna of the antenna in package to form the radio frequency link; and
  the at least one testing terminal of the antenna in package is configured to form a testing loop using external test equipment and the radio frequency link during testing the radio frequency link.

11. The radio frequency chip according to claim 10, wherein the at least one testing terminal of the antenna in package is further configured to connect to a reference ground or form a short circuit with the reference ground.

12. The radio frequency chip according to claim 10, wherein each coupling structure of the one or more coupling structures comprise a sampling unit and a signal transmission path;
  wherein the sampling unit is coupled to at least one corresponding radiation unit of the one or more radiation units, and the sampling unit is configured to collect the radio frequency test signals from the at least one corresponding radiation unit of the one or more radiation units; and
  the signal transmission path is coupled to the sampling unit and a respective testing terminal of the at least one testing terminal, wherein the signal transmission path is configured to transmit the radio frequency test signals.

13. The radio frequency chip according to claim 12, wherein the sampling unit comprises a sheet-shaped structure, and there is an induction gap between the sheet-shaped structure and the at least one corresponding radiation unit of the one or more radiation units, in order for the sheet-shaped structure to inductively couple with the at least one corresponding radiation unit of the one or more radiation units.

14. The radio frequency chip according to claim 12, wherein a metal structure in the signal transmission path comprises at least one of: metal via holes connecting different metal layers in the package body, a microstrip line disposed in at least one metal layer, a coaxial line, and solder pads.

15. The radio frequency chip according to claim 10, wherein a number of the one or more coupling structures corresponds to a number of the at least one antenna, and each coupling structure of the one or more coupling structures is coupled to a respective antenna; or
  the number of the one or more coupling structures is less than the number of the at least one antenna, and at least one coupling structure of the one or more coupling structures is coupled to a plurality of corresponding antennas.

16. The radio frequency chip according to claim 10, further comprising a feeding structure;
  wherein the feeding structure is electromagnetically coupled to the one or more radiation units and is configured to transmit or receive the radio frequency test signals through the one or more radiation units.

17. A test device for a radio frequency chip, comprising a testing circuit board and a chip linking socket;
  wherein the testing circuit board has at least one signal transmission path configured for testing the radio frequency chip according to claim 10; and
  the chip linking socket is disposed on the testing circuit board and is configured to connect to the at least one testing terminal in the radio frequency chip, in order to transmit the radio frequency test signals from a radio frequency test link for the at least one testing terminal using the at least one signal transmission path of the testing circuit board.

18. The test device according to claim 17, wherein the chip linking socket comprises a cover plate and a plurality of probes;
  wherein the cover plate is configured to press on the radio frequency chip; and
  one probe of the plurality of probes is coupled to the at least one signal transmission path and is configured to connect to the at least one testing terminal, in order to communicate with the radio frequency test link.

19. The test device according to claim 17, further comprising:
  a first testing unit coupled to a signal transmission path in the testing circuit board and configured to convert the radio frequency test signals into intermediate frequency test signals; and
  a second testing unit coupled to another signal transmission path in the testing circuit board and configured to convert the intermediate frequency test signals into the radio frequency test signals.

20. A test method for a radio frequency chip, applicable to test the radio frequency chip according to claim 10, wherein the method comprises:
  acquiring, using a first radio frequency test link of the radio frequency chip formed by a first probe, a first signal transmission path, and a first testing terminal of the radio frequency chip to be tested, radio frequency test signals from a transmission antenna of the radio frequency chip, and testing a radio frequency transmission link of the radio frequency chip; or
  transmitting, using a second radio frequency test link of the radio frequency chip formed by a second probe, a second signal transmission path, and a second testing terminal of the radio frequency chip to be tested, the radio frequency test signals to a reception antenna of the radio frequency chip, and testing a radio frequency reception link of the radio frequency chip.

* * * * *